United States Patent
Mountain

[11] Patent Number: 6,017,822
[45] Date of Patent: Jan. 25, 2000

[54] METHOD OF THINNING SEMICONDUCTOR WAFER OF SMALLER DIAMETER THAN THINNING EQUIPMENT WAS DESIGNED FOR

[75] Inventor: David J. Mountain, Baltimore, Md.

[73] Assignee: The United States of America as represented by The National Security Agency, Ft. Meade, Md.

[21] Appl. No.: 09/154,040

[22] Filed: Sep. 16, 1998

[51] Int. Cl.[7] .................................................. H01L 21/302
[52] U.S. Cl. .......................................................... 438/692
[58] Field of Search .................................. 438/691, 692, 438/693, 458, 459, 457, 15

[56] References Cited

U.S. PATENT DOCUMENTS

| | | | |
|---|---|---|---|
| 4,266,334 | 5/1981 | Edwards et al. | 438/64 |
| 4,946,716 | 8/1990 | Corrie | 438/977 |
| 5,071,792 | 12/1991 | VanVonno et al. | 438/17 |
| 5,256,599 | 10/1993 | Asetta et al. | |
| 5,273,940 | 12/1993 | Sanders | |
| 5,324,687 | 6/1994 | Wojnarowski | |
| 5,344,524 | 9/1994 | Sharma et al. | 438/691 |
| 5,348,607 | 9/1994 | Wojnarowski et al. | 156/298 |
| 5,656,552 | 8/1997 | Hudak et al. | 438/15 |
| 5,893,755 | 4/1999 | Nakayoshi | 438/692 |
| 5,927,993 | 7/1999 | Lesk et al. | 438/459 |

OTHER PUBLICATIONS

U.S. application No. 08/900,869, Mountain, filed Jul. 25, 1997.

*Primary Examiner*—Benjamin L. Utech
*Assistant Examiner*—Duy-Vu Deo
*Attorney, Agent, or Firm*—Robert D. Morelli

[57] ABSTRACT

A method of thinning a product wafer using equipment designed for a wafer diameter, where the diameter of the product wafer is smaller than the wafer diameter of the thinning equipment by cutting an opening in a template wafer, where the template wafer is of a diameter that may be thinned by the thinning equipment, and where the opening accommodates the product wafer; affixing the template wafer to a holding material; affixing the product wafer to the holding material and inside of the template wafer with the integrated circuit side up; depositing an etch stop onto a handle wafer, where the handle wafer is at least as large as the template wafer; bonding adhesively the product wafer to the etch stop; removing the holding material; filling any gaps between the product wafer and the template wafer; using wax to make the product wafer sufficiently planar; thinning the product wafer using the thinning equipment; removing any excess wax; bonding adhesively the product wafer to a transfer wafer, where the transfer wafer is at least as large as the template wafer; removing the handle wafer; removing the etch stop; and removing any adhesive that remains on the product wafer.

15 Claims, 4 Drawing Sheets

METHOD OF THINNING SEMICONDUCTOR WAFER OF SMALLER DIAMETER THAN THINNING EQUIPMENT WAS DESIGNED FOR

FIELD OF THE INVENTION

The present invention relates, in general, to a semiconductor device manufacturing process and, in particular, to a method of thinning a semiconductor wafer of a diameter that is smaller than the wafer diameter for which the thinning equipment was designed to process.

BACKGROUND OF THE INVENTION

For economies of scale, integrated circuits (or die) are fabricated in a batch on a semiconductor wafer. The upper limit on wafer diameter continues to go up. Presently, the state of the art in wafer diameter is 200 millimeters, or around eight inches, with experimental wafers in the 300 millimeter, or twelve inch, range.

Semiconductor equipment manufactures often tailor equipment to a particular wafer diameter or range of wafer diameters. As wafer diameters increase, the equipment built to process the smaller diameter wafers becomes obsolete. Typically, this does not cause a problem since the die on the larger diameter wafers is the only device that is processed and a change in the wafer diameter may require an upgrade of all of the equipment needed to process the larger wafer. However, this does cause a problem for those who manufacturer multi-chip modules (MCMs).

An MCM is a type of package that contains more than one integrated circuit. MCM manufacturers often receive the integrated circuits to be built into an MCM in wafer form. An MCM module may contain the latest microprocessor which may be fabricated in the most expensive state-of-the-art process (i.e., largest diameter wafer process) as well as single transistors which may be fabricated in the most economical fabrication process (i.e., a smaller wafer diameter process that is a couple of generations older than the state-of-the-art). So, MCM manufacturers must often handle wafers of different diameters. It would be prohibitively expensive for an MCM manufacturer to operate and maintain multiple sets of equipment to handle different diameter wafers.

MCM manufactures are always looking for ways to reduce the size of the integrated circuits that are contained within an MCM. reducing the size of the integrated circuits may reduce the size of the MCM. having an MCM that fits into a place that it did not fit in before may create a new market. Furthermore, reducing the size of the integrated circuits that go into the MCM may create space in an MCM of a particular size where other integrated circuits may be placed. Adding integrated circuits to an MCM may increase performance or functionality.

One of the ways that MCM manufacturers reduce the size of the integrated circuits contained in an MCM is to thin the integrated circuits. Since the integrated circuits may be received in wafer form and the wafers may come in different diameters, it would be more economical for an MCM manufacturer if it were able to thin semiconductor wafers of different diameters on the equipment that it presently has for thinning wafers. Since wafers of the same diameter are already properly sized for the thinning equipment, and wafers of larger diameter may be reduced in diameter to be of proper size, the present invention is a method of thinning wafers of diameters that are smaller than the thinning equipment was designed to thin.

U.S. patent application Ser. No. 08/900,869, filed Jul. 25, 1997, entitled "METHOD OF THINNING INTEGRATED CIRCUITS RECEIVED IN DIE FORM," discloses a method of placing individual die with an opening cut in a wafer to form a pseudo-wafer so that individual die or any type may be thinned. The present invention uses a wafer with an opening cut therein in its method of thinning a wafer of a smaller diameter than the thinning equipment was designed to thin.

U.S. Pat. No. 5,256,599, entitled "SEMICONDUCTOR WAFER WAX MOUNTING AND THINNING PROCESS," discloses a method of thinning an entire wafer. U.S. Pat. No. 5,256,599 does not disclose a method of thinning a wafer of a smaller diameter than the thinning equipment was designed to thin as does the present invention. U.S. Pat. No. 5,256,599 is hereby incorporated by reference into the specification of the present invention.

U.S. Pat. No. 5,273,940, entitled "MULTIPLE CHIP PACKAGE WITH THINNED SEMICONDUCTOR CHIPS," discloses a method of electrically connecting standard thickness dice in a multi-chip-module, encapsulating the dice, and thinning the encapsulant and the dice. U.S. Pat. No. 5,273,940 does not disclose a method of thinning a wafer of a smaller diameter than the thinning equipment was designed to thin as does the present invention. U.S. Pat. No. 5,273,940 is hereby incorporated by reference into the specification of the present invention.

U.S. Pat. No. 5,324,687, entitled "METHOD FOR THINNING OF INTEGRATED CIRCUIT CHIPS FOR LIGHTWEIGHT PACKAGED ELECTRONIC SYSTEMS," discloses a method of placing standard thickness dice circuit-side up in various wells in a semiconductor wafer. U.S. Pat. No. 5,324,687 does not disclose a method of thinning a wafer of a smaller diameter than the thinning equipment was designed to thin as does the present invention. U.S. Pat. No. 5,324,687 is hereby incorporated by reference into the specification of the present invention.

SUMMARY OF THE INVENTION

It is an object of the present invention to thin a semiconductor wafer of a diameter that is smaller than the thinning equipment was designed to thin.

It is another object of the present invention to thin a semiconductor wafer of a diameter that is smaller than the thinning equipment was designed to thin by placing the wafer to be thinned within an opening in a wafer that is of a diameter that the thinning equipment was designed to thin.

The present invention is a method of thinning a semiconductor wafer that is of a diameter that is smaller than the thinning equipment was designed to thin.

The first step of the method is to acquire a first semiconductor wafer, or product wafer, that contains integrated circuits that are to be thinned, where the product wafer is of a diameter that is smaller than may be thinned by thinning equipment presently available.

The second step of the method is to cut an opening in a second semiconductor wafer, or template wafer, where the template wafer is of a diameter that may be thinned by the thinning equipment, and where the opening is large enough for the product wafer to fit therein.

The third step of the method is to adhesively affix the template wafer to a holding material.

The fourth step of the method is to adhesively affix the product wafer to the holding material so that the product wafer is within the opening of the template wafer, where the integrated-circuit side of the product wafer does not contact the holding material.

The fifth step of the method is to deposit an etch stop onto a third semiconductor, or handle wafer, where the handle wafer is of a diameter that is at least as large as the template wafer.

The sixth step of the method is to adhesively bond the combination of product wafer, template wafer, and holding material onto the etch stop so that the integrated-circuit side of the product wafer is facing the etch stop.

The seventh step of the method is to remove the holding material.

The eighth step of the method is to fill any gaps between the product wafer and the template wafer with a suitable material such as acrylic, epoxy, wax, or BCB.

The ninth step of the method is to coat the product wafer and the template wafer with wax if the surface of the product wafer and the template wafer is not sufficiently planar.

The tenth step of the method is to thin the product wafer and the template wafer using thinning equipment designed to thin wafers of a diameter of the template wafer to a thickness in a range of from 5 microns to 100 microns by grinding, etching, and polishing.

The eleventh step of the method is to remove any wax from the product wafer and the template wafer.

The thirteenth step of the method is to adhesively bond the product wafer and the template wafer to a fourth semiconductor wafer, or transfer wafer, where the transfer wafer is of a diameter that is at least as large as the template wafer.

The fourteenth step of the method is to remove the handle wafer.

The fifteenth step of the method is to remove the etch stop.

The sixteenth step of the method is to remove the adhesive that was on the etch stop.

The integrated circuits on the product wafer may now be electrically tested. The functional integrated circuits may then be removed from the transfer wafer and used as desired (e.g., placed in an MCM).

DETAILED DESCRIPTION

The present invention is a method of thinning a wafer of a particular diameter on thinning equipment that was designed to thin a wafer that is larger than that particular diameter and would not, normally, be able to thin a wafer of that particular diameter.

Figure 1:
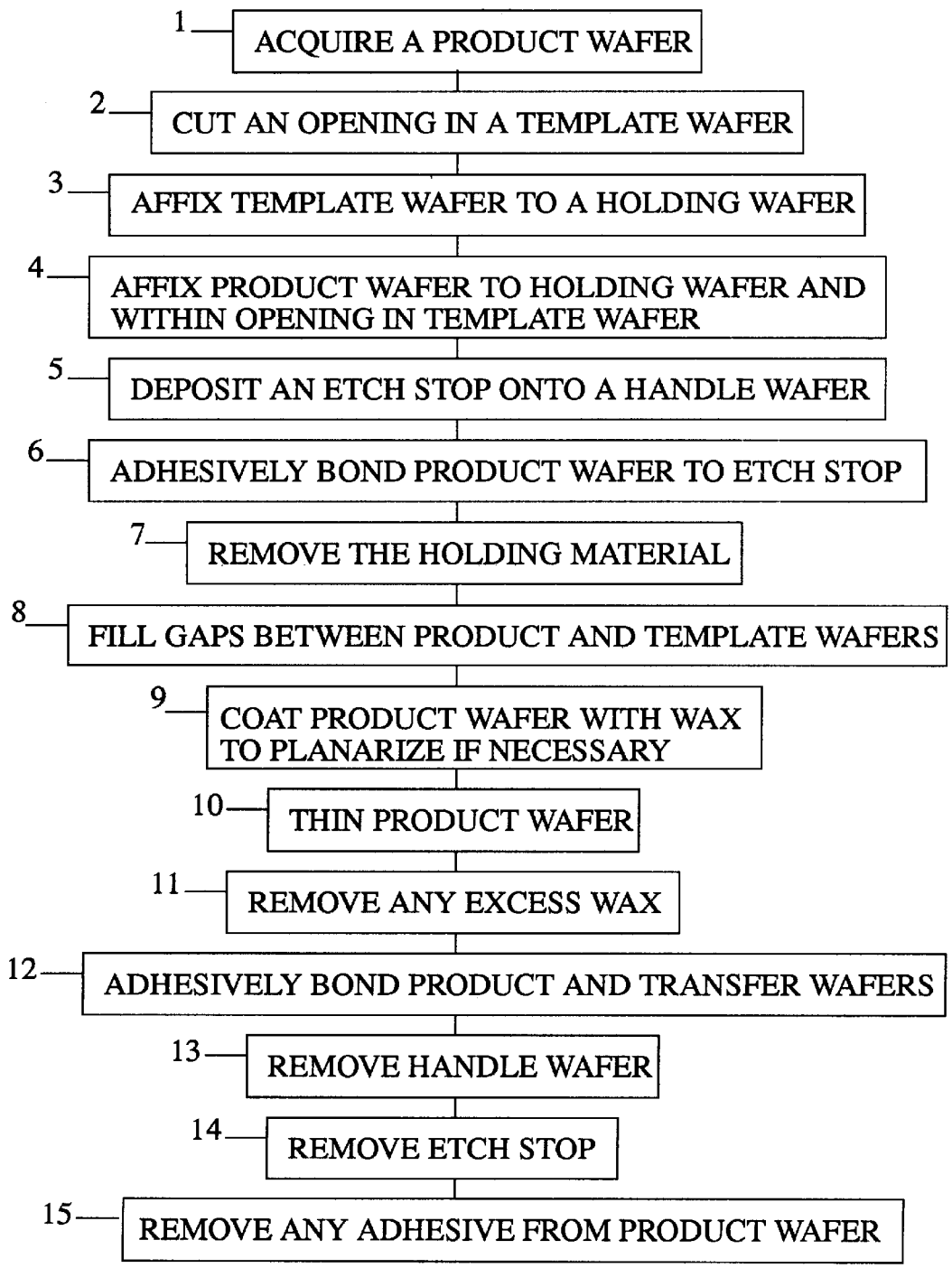
FIG. 1 is a list of the steps in the present invention.
Figure 2:
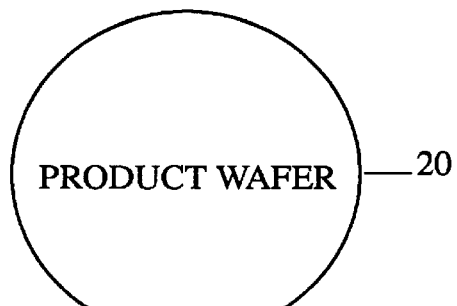
FIG. 2 is a top view of a product wafer.

FIG. 1 lists the steps of the present invention. The first step 1 of the method is to acquire a first semiconductor wafer, or product wafer, that contains integrated circuits to be thinned, where the diameter of the product wafer is smaller than the minimum diameter that the thinning equipment owned by the user was designed to accept. FIG. 2 is a top view of a product wafer 20. Typically, product wafers are received in a condition that allows the integrated circuits to be bonded into a circuit. That is, the bond pads are exposed but the rest of the integrated circuit is protected with a coating (e.g., silicon dioxide, metal, polyimide, etc.). In an alternate embodiment, the user may wish to deposit a protective layer on the product wafer in order to protect the product wafer during the thinning process. For example, chemicals used during the present method may attack the exposed pads if the product wafer were not so protected.

Figure 3:
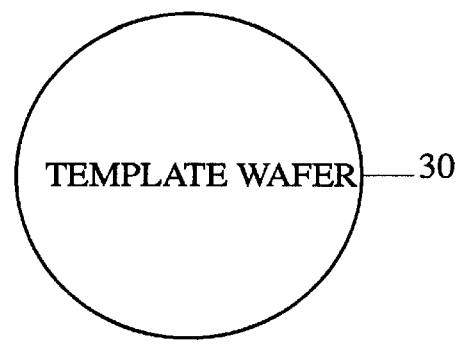
FIG. 3 is a top view of a template wafer.
Figure 4:
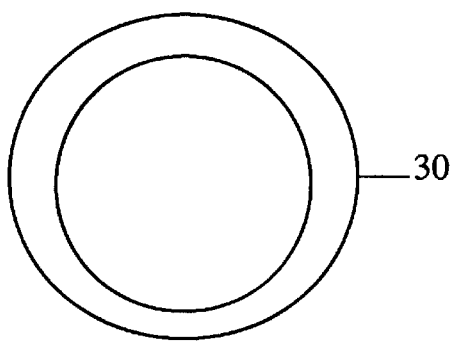
FIG. 4 is a top view of the template wafer with an opening cut therein to accept the product wafer.

The second step 2 of the method listed in FIG. 1 is to cut an opening in a second semiconductor wafer, or template wafer, where the template wafer is of a diameter that may be thinned by the thinning equipment owned by the user, and where the opening is large enough for the product wafer to fit therein. FIG. 3 is a top view of a template wafer 30, and FIG. 4 is a top view of the template wafer 30 with an opening cut therein. The opening may be cut by any suitable means (e.g., laser), and the opening may be any shape that will accommodate the product wafer 20.

Figure 5:
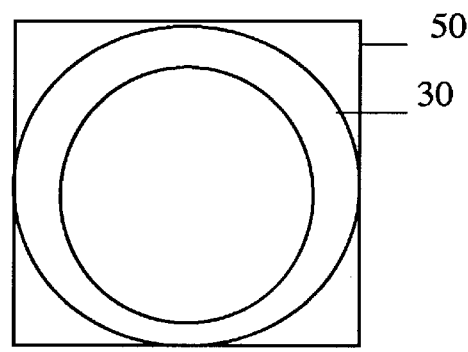
FIG. 5 is a top view of the template wafer adhesively affixed to a holding material.

The third step 3 of the method listed in FIG. 1 is to adhesively affix the template wafer to a holding material. FIG. 5 is a top view of the template wafer 30 affixed to the holding material 50. The holding material 50 may be any suitable material such as a commercial product called Gel-Pak.

Figure 6:
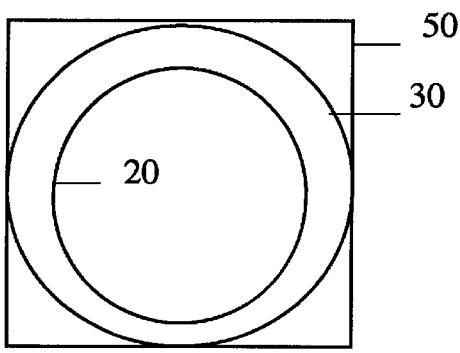
FIG. 6 is a top view of the product wafer within the opening of the template wafer on the holding material.

The fourth step 4 of the method listed in FIG. 1 is to adhesively affix the product wafer to the holding material so that the product wafer is within the opening of the template wafer, where the integrated-circuit side of the product wafer does not contact the holding material. That is, the integrated circuits are face-up on the holding material. FIG. 6 is a top view of the template wafer 30 affixed to the holding material 50 with the product wafer 20 affixed to the holding material and contained within the opening of the template wafer 30.

Figure 7:
FIG. 7 is a side view of the handle wafer.
Figure 8:
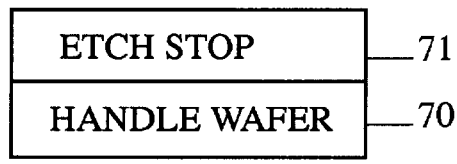
FIG. 8 is a side view of the handle wafer with an etch stop deposited thereon.

The fifth step 5 of the method listed in FIG. 1 is to deposit an etch stop onto a third semiconductor, or handle wafer, where the handle wafer is of a diameter that is at least as large as the template wafer. FIG. 7 is a side view of a handle wafer 70. FIG. 8 is a side view of the handle wafer 70 with an etch stop 71 deposited thereon. The etch stop material may be selected from the group consisting of silicon dioxide, silicon nitride, metal, polymer, silicon carbide, and bisbenzocyclobutene resin (BCB). The etch stop material may be deposited using any conventional semiconductor deposition technique. In the preferred embodiment, the etch stop includes a layer of oxide, a layer of nitride, and a layer of aluminum.

Figure 9:
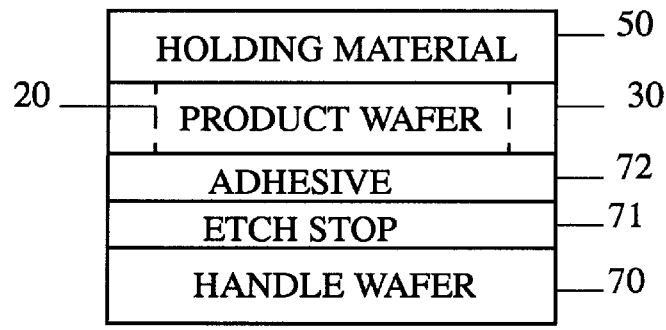
FIG. 9 is a side view of product wafer affixed to the handle wafer.

The sixth step 6 of the method listed in FIG. 1 is to adhesively bond the product wafer, and everything attached thereto, to the etch stop so that the integrated circuits contained on the product wafer are face down on the handle wafer. The adhesive may be selected from the group consisting of acrylic, epoxy, wax, or bisbenzocyclobutene resin (BCB). FIG. 9 is a side view of the result of bonding the product wafer 20, and everything attached thereto, to the handle wafer 70, and everything attached thereto. The result is a sandwich, from bottom to top, of a handle wafer 70, an etch stop 71, adhesive 72, the product wafer 20 contained within the template wafer 30, and the holding material 50.

Figure 10:
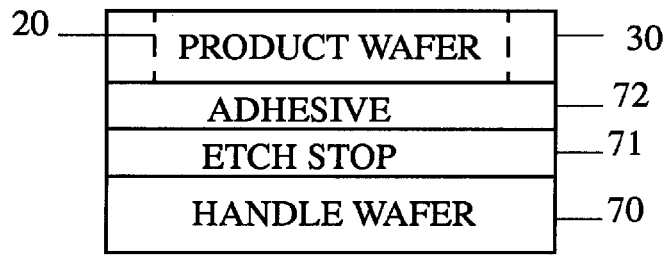
FIG. 10 is a side view of the product wafer with the holding material removed.

The seventh step 7 of the method listed in FIG. 1 is to remove the holding material. Any suitable removal technique will do. FIG. 10 is a side view of the resulting structure with the holding material 50 removed. If the holding material is Gel-Pak then the preferred method of removal is to peel the Gel-Pak off.

The eighth step 8 of the method listed in FIG. 1 is to fill any gaps between the product wafer and the template wafer with a suitable material such as acrylic, epoxy, wax, or BCB. This step is not depicted in a figure.

The ninth step 9 of the method listed in FIG. 1 is to coat the product wafer and the template wafer with wax if the surface of the product wafer and the template wafer is not sufficiently planar. This step is not depicted in a figure.

The tenth step 10 of the method listed in FIG. 1 is to thin the product wafer and the template wafer using thinning equipment available to the user that was designed to thin wafers of a diameter of the template wafer to a thickness in a range of from 5 microns to 100 microns by grinding, etching, and polishing. This step is not depicted in a figure.

The eleventh step 11 of the method listed in FIG. 1 is to remove any remaining wax from the product wafer and the template wafer. This step is not depicted in a figure.

Figure 11:
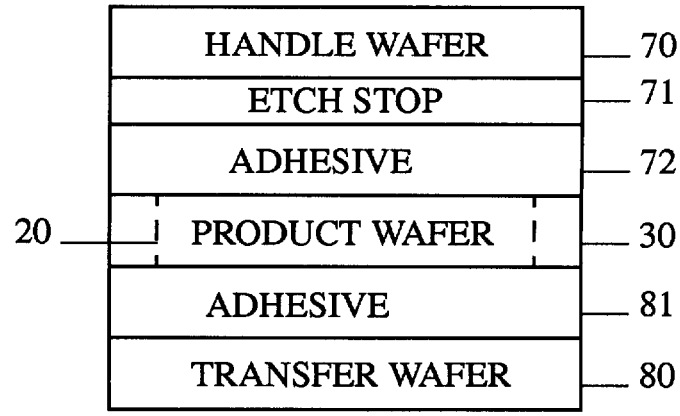
FIG. 11 is a side view of product wafer affixed to the transfer wafer.

The twelfth step 12 of the method listed in FIG. 1 is to adhesively bond the product wafer and the template wafer to a fourth semiconductor wafer, or transfer wafer, where the transfer wafer is of a diameter that is at least as large as the template wafer. FIG. 11 is a side view of the resulting structure. That is, from bottom to top, the transfer wafer 80 is covered by adhesive 81. The adhesive 81 is selected from the same group as was the adhesive 72 in FIG. 9. The thinned product wafer 20 and the thinned template wafer 30 is affixed to the adhesive 81. Note that the integrated circuits on the product wafer 20 are now face up. Adhesive 72 covers the product wafer 20 and the template wafer 30. The etch stop 71 covers the adhesive 72. The handle wafer 70 covers the etch stop 71.

Figure 12:
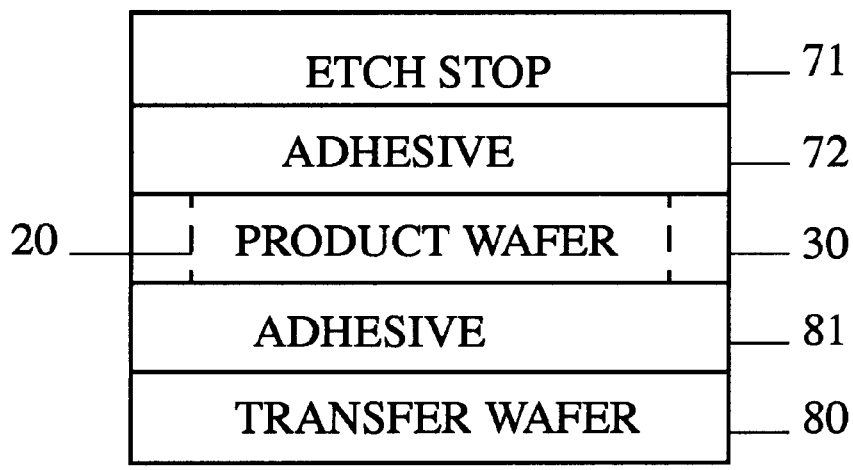
FIG. 12 is a side view of the product wafer with the handle wafer removed.

The thirteenth step 13 of the method listed in FIG. 1 is to remove the handle wafer. FIG. 12 is a side view of the structure shown in FIG. 11 with the handle wafer 70 removed. Any conventional semiconductor material removal technique may be used to remove the handle wafer 70.

Figure 13:
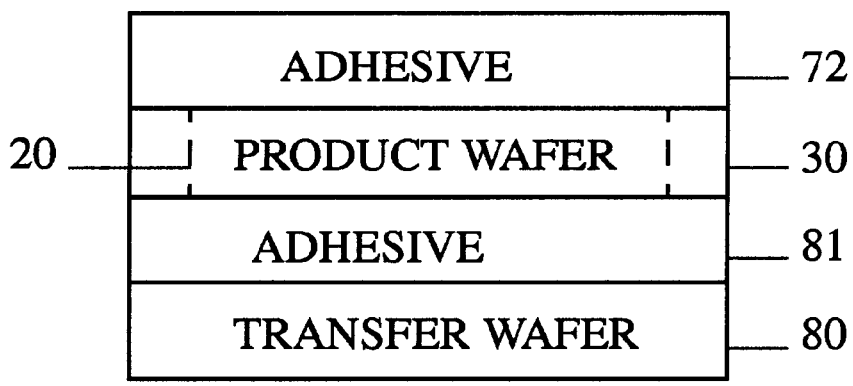
FIG. 13 is a side view of the product wafer with the etch stop removed.

The fourteenth step 14 of the method listed in FIG. 1 is to remove the etch stop. FIG. 13 is a side view of the structure shown in FIG. 12 with the etch stop removed. Any suitable etch stop removal technique may be used.

Figure 14:
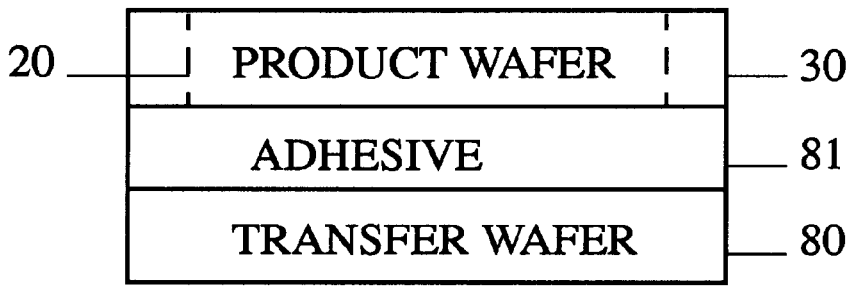
FIG. 14 is a side view of the product wafer with the adhesive over the product wafer removed.

The fifteenth step 15 of the method listed in FIG. 1 is to remove the adhesive that was on the etch stop. FIG. 14 is a side view of the structure shown in FIG. 13 with the adhesive 72 removed. Any suitable adhesive removal technique may be used. In an alternate embodiment of the present method where the user deposited a protective layer on the product wafer, an additional step not depicted in a figure would be to remove the protective layer.

The integrated circuits on the product wafer 20 are now face up and may be electrically tested. The functional integrated circuits may then be diced from the product wafer 20 and removed from the transfer wafer 80. The removed integrated circuits may then be placed in an MCM.

What is claimed is:

1. A method of thinning a first semiconductor wafer containing integrated circuits using thinning equipment designed for a wafer diameter, that is larger than the diameter of the first semiconductor wafer, comprising the steps of:

a) cutting an opening in a second semiconductor wafer, where the second semiconductor wafer is of a diameter that may be thinned by the thinning equipment, and where the opening is large enough for the first semiconductor wafer to fit therein;

b) affixing adhesively the second semiconductor wafer to a holding material;

c) affixing adhesively first semiconductor wafer to the holding material so that the first semiconductor wafer is within the opening of the second semiconductor wafer, where an integrated-circuit side of the first semiconductor wafer does not contact the holding material;

d) depositing an etch stop onto a third semiconductor wafer, where the third semiconductor wafer is of a diameter that is at least as large as the second semiconductor wafer;

e) bonding adhesively the product wafer to the etch stop so that the integrated-circuit side of the first semiconductor wafer is in contact with the adhesive;

f) removing the holding material;

g) filling any gaps between the first semiconductor wafer and the second semiconductor wafer with a suitable material;

h) coating the first semiconductor wafer and the second semiconductor wafer with wax if the surface of the first semiconductor wafer and the second semiconductor wafer is not planar;

i) thinning the first semiconductor wafer and the second semiconductor wafer to a thickness in a range of from 5 microns to 100 microns using the thinning equipment;

j) removing any wax from the first semiconductor wafer and the second semiconductor wafer;

k) bonding adhesively the first semiconductor wafer side of the result of step (j) to a fourth semiconductor wafer, where the fourth semiconductor wafer is of a diameter that is at least as large as the second semiconductor wafer;

l) removing the second semiconductor wafer;

m) removing the etch stop; and n) removing any adhesive that remains on the first semiconductor wafer.

2. The method of claim 1, wherein said step of depositing an etch stop is comprised of the step of depositing an etch stop selected from the group consisting of silicon dioxide, silicon nitride, metal, polymer, polyimide, silicon carbide, and bisbenzocyclobutene resin.

3. The method of claim 2, wherein each said step of bonding adhesively is comprised of bonding adhesively using an adhesive selected from the group consisting of epoxy, wax, polyimide, bisbenzocyclobutene resin, and acrylic.

4. The method of claim 3, wherein said step of filling any gaps between the first semiconductor wafer and the second semiconductor wafer is comprised of filling any gaps using a material selected from the group consisting of acrylic, epoxy, wax, polyimide and, bisbenzocyclobutene resin.

5. The method of claim 4, wherein said steps of thinning the first semiconductor wafer and the second semiconductor wafer, removing the second semiconductor wafer, removing the etch stop, removing the adhesive that was on the etch stop are each comprised of doing said step using a removal technique selected from the group consisting of mechanical grinding, chemical etching, and a combination of mechanical grinding and chemical etching.

6. The method of claim 5, further comprising the step of depositing a protective layer on the first semiconductor wafer prior to step (d).

7. The method of claim 6, wherein said step of depositing a protective layer is comprised of depositing a protective layer selected from the group consisting of silicon dioxide, metal, and polyimide.

8. The method of claim 7, further comprising the step of removing said protective layer deposited on the first semiconductor wafer after step (n).

9. The method of claim 1, wherein each said step of bonding adhesively is comprised of bonding adhesively using an adhesive selected from the group consisting of epoxy, wax, polyimide, bisbenzocyclobutene resin, and acrylic.

10. The method of claim 1, wherein said step of filling any gaps between the first semiconductor wafer and the second semiconductor wafer is comprised of filling any gaps using a material selected from the group consisting of acrylic, epoxy, wax, polyimide and, bisbenzocyclobutene resin.

11. The method of claim 1, wherein said steps of thinning the first semiconductor wafer and the second semiconductor wafer, removing the second semiconductor wafer, removing the etch stop, removing the adhesive that was on the etch stop are each comprised of doing said step using a removal technique selected from the group consisting of mechanical grinding, chemical etching, and a combination of mechanical grinding and chemical etching.

12. The method of claim 1, further comprising the step of depositing a protective layer on the first semiconductor wafer prior to step (d).

13. The method of claim 12, wherein said step of depositing a protective layer is comprised of depositing a protective layer selected from the group consisting of silicon dioxide, metal, and polyimide.

14. The method of claim 13, further comprising the step of removing said protective layer deposited on the first semiconductor wafer after step (n).

15. The method of claim 12, further comprising the step of removing said protective layer deposited on the first semiconductor wafer after step (n).

* * * * *